United States Patent
Kim et al.

(10) Patent No.: US 6,306,689 B1
(45) Date of Patent: Oct. 23, 2001

(54) ANTI-FUSE FOR PROGRAMMING REDUNDANCY CELL, REPAIR CIRCUIT HAVING PROGRAMMING APPARATUS, AND FABRICATION METHOD OF ANTI-FUSE

(75) Inventors: Mi-Ran Kim, Yicheon; Myoung-Sik Chang; Jin-Kook Kim, both of Seoul, all of (KR)

(73) Assignee: Hyundai Electronics Industries Co., Ltd., Yicheon (KR)

( * ) Notice: Subject to any disclaimer, the term of this patent is extended or adjusted under 35 U.S.C. 154(b) by 0 days.

(21) Appl. No.: 09/220,801

(22) Filed: Dec. 28, 1998

(30) Foreign Application Priority Data

Jun. 11, 1998 (KR) .................................. 98-21787

(51) Int. Cl.[7] .................................................. H01L 21/82
(52) U.S. Cl. .......................... 438/131; 438/215; 438/281; 438/600; 257/529; 257/530
(58) Field of Search ..................... 438/131, 132, 438/600, 601, 215, 333, 281; 257/529, 530

(56) References Cited

U.S. PATENT DOCUMENTS

| | | | |
|---|---|---|---|
| 4,651,409 | * 3/1987 | Ellsworth et al. | 438/207 |
| 5,308,795 | * 5/1994 | Hawley et al. | 438/600 |
| 5,602,053 | * 2/1997 | Zheng et al. | 438/600 |
| 5,723,358 | 3/1998 | Manley | 438/600 |
| 5,726,483 | 3/1998 | Dennison | 257/530 |

* cited by examiner

Primary Examiner—Vu A. Le
Assistant Examiner—Christian D. Wilson
(74) Attorney, Agent, or Firm—Oliff & Berridge, PLC

(57) ABSTRACT

An anti-fuse for programming a redundancy cell and a repair circuit having a programming apparatus are disclosed. The circuit includes a half power voltage supplier for supplying a half power voltage, a programming voltage supplier for supplying a programming voltage for exchanging a defective cell of the memory cell array with a redundancy cell, a ground voltage supplier for supplying a ground electric potential in response to an address signal of the memory cell, an anti-fuse for receiving a voltage of the half power voltage supplier and charging the same in the normal operation and breaking a dielectric film in accordance with a voltage difference between the programming voltage supplier and the ground voltage supplier during the programming operation for thereby implementing a programming, and an output unit for outputting an output signal based on the programmed state of the anti-fuse in accordance with a voltage applied from a node commonly connected with the half power voltage supplier, the programming voltage supplier, and the anti-fuse, for thereby enhancing a fabrication yield and reliability of a memory apparatus by easily exchanging a defective cell with a redundancy cell using a threshold voltage of a dielectric film without using an expensive laser apparatus.

8 Claims, 6 Drawing Sheets

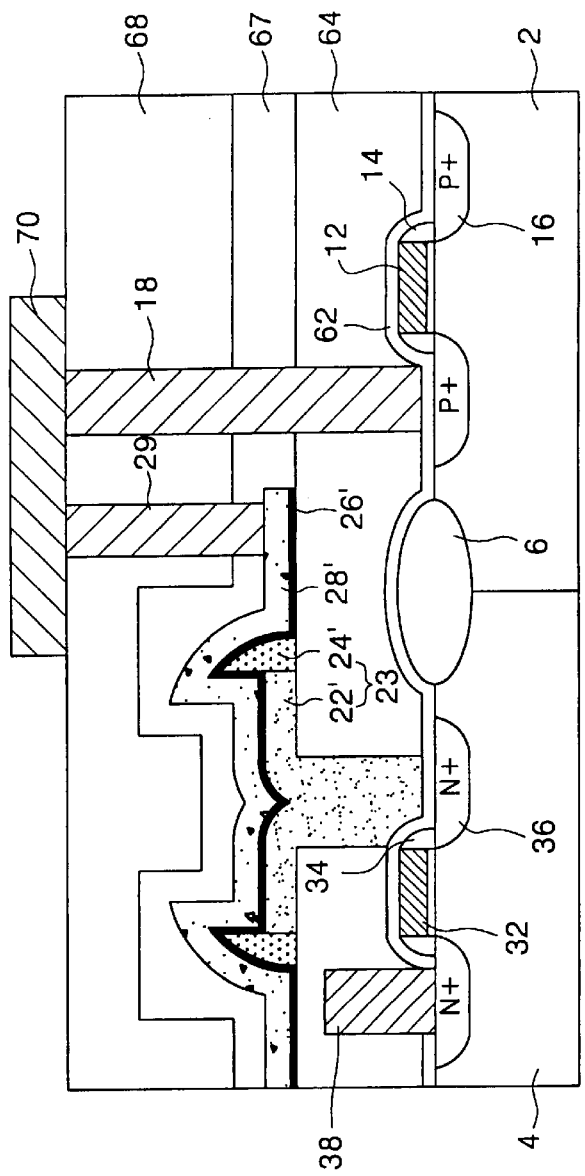
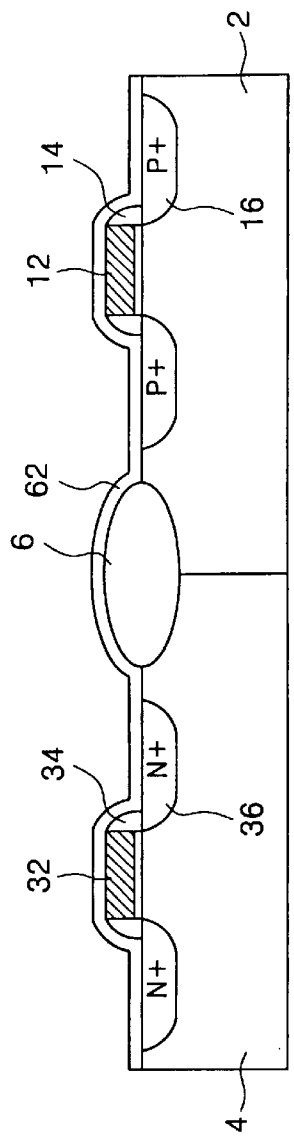
Fig. 2
Fig. 3

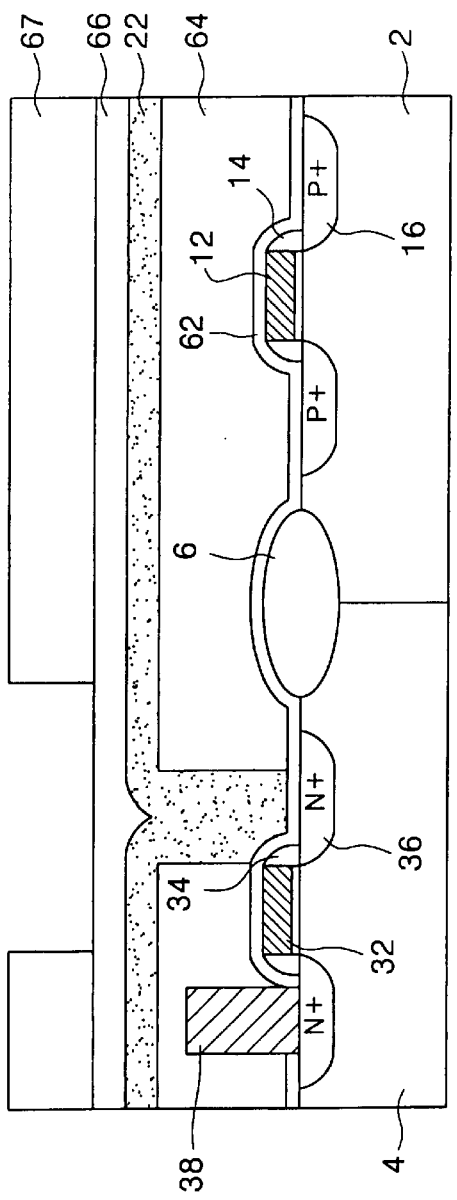
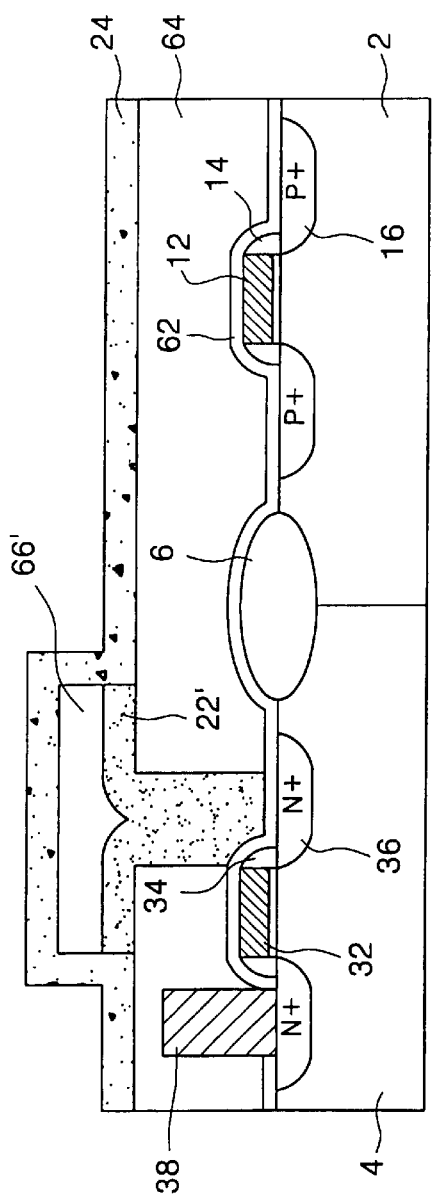
Fig. 6
Fig. 7

ANTI-FUSE FOR PROGRAMMING REDUNDANCY CELL, REPAIR CIRCUIT HAVING PROGRAMMING APPARATUS, AND FABRICATION METHOD OF ANTI-FUSE

BACKGROUND OF THE INVENTION

1. Field of the Invention

The present invention relates to a semiconductor memory apparatus and a fabrication method of the same, and in particular to an anti-fuse for programming a redundancy cell, a repair circuit having a programming apparatus, and a fabrication method of the anti-fuse which are capable of simply implementing a programming operation when exchanging a defective cell of a semiconductor memory apparatus with a redundancy cell.

2. Description of the Conventional Art

Generally, in the semiconductor memory apparatus, a plurality of redundancy cells of a memory are connected by the block formed of sub-arrays. For example, extra rows and columns are connected at every 256K cell array for thereby exchanging a defective memory cell with an extra cell by the unit of row and column. In such a repair circuit, when a wafer fabrication process is completed, the defective cells are removed based on a predetermined test, and an address signal of a corresponding redundancy cell is changed in an internal circuit through a programming operation, so that when an address corresponding to a defective line is inputted during an actual use, the line is exchanged with a line of a corresponding cell. As the programming methods, an electric fuse method which is capable of melting and cutting a fuse using an over-current, a method for burning the fuse using a laser beam, a method for making a junction portion short-circuit using a laser beam, etc. are known. Among these methods, the method for cutting the fuse using a laser beam is simple, and in this method, it is possible to easily implement a desired layout.

However, in the laser-based programming method, a repair process which needs an expensive laser apparatus for exchanging a defective cell with a redundancy cell is used. In addition, a laser beam is radiated onto the fuse by an additional fuse window process for cutting the same, and then the programming and a passivation process are performed, whereby the repair process is complicated.

SUMMARY OF THE INVENTION

Accordingly, it is an object of the present invention to provide a semiconductor memory apparatus and a fabrication method of the same which overcome the aforementioned problems encountered in the conventional art.

It is another object of the present invention to provide an anti-fuse for programming a redundancy cell and a repair circuit having a programming apparatus which are capable of enhancing a fabrication yield and reliability of a memory apparatus by easily exchanging a defective cell with a redundancy cell using a threshold voltage of a dielectric film without using an expensive laser apparatus.

It is another object of the present invention to provide an anti-fuse fabrication method for programming a redundancy cell which makes it possible to easily exchange a defective cell with a redundancy cell using a threshold voltage of a dielectric film.

In order to achieve the above objects, there is provided a repair circuit which includes a half power voltage supplier for supplying a half power voltage, a programming voltage supplier for supplying a programming voltage for exchanging a defective cell of the memory cell array with a redundancy cell, a ground voltage supplier for supplying a ground electric potential in response to an address signal of the memory cell, an anti-fuse for receiving a voltage of the half power voltage supplier and charging the same in the normal operation and breaking a dielectric film in accordance with a voltage difference between the programming voltage supplier and the ground voltage supplier during the programming operation for thereby implementing a programming, and an output unit for outputting an output signal based on the programmed state of the anti-fuse in accordance with a voltage applied from a node commonly connected with the half power voltage supplier, the programming voltage supplier, and the anti-fuse.

In order to achieve the above objects, there is provided an anti-fuse of a repair circuit for programming a redundancy cell which includes a lower electrode having a spacer having its apex at an outer portion of the same, a dielectric film formed on an upper portion of the lower electrode, and an upper electrode formed on an upper portion of the dielectric film, whereby the dielectric film contacting with the spacer of the lower electrode is broken during the programming.

In order to achieve the above objects, there is provided an anti-fuse fabrication method of a repair circuit for programming a redundancy cell which includes the steps of forming a lower interlayer insulation film on an upper portion of a semiconductor device including a dopant implantation region formed on a semiconductor substrate, forming a lower electrode contacting with a dopant implantation region of the semiconductor device through a contact hole in the lower interlayer insulation film and having a spacer having its apex at an outer portion of the same, forming a dielectric film on an upper portion of the lower electrode, and forming an upper electrode on an upper portion of the dielectric film.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims as a result of the experiment compared to the conventional arts.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2 is a vertical cross-sectional view illustrating a semiconductor apparatus including a repair circuit having a programming apparatus and an anti-fuse according to the present invention; and FIGS. 3 through 10 are cross-sectional views illustrating a method for fabricating a semiconductor apparatus having an anti-fuse according to the present invention.

DETAILED DESCRIPTION OF THE INVENTION

The embodiments of the present invention will be explained with reference to the accompanying drawings.

Figure 1:
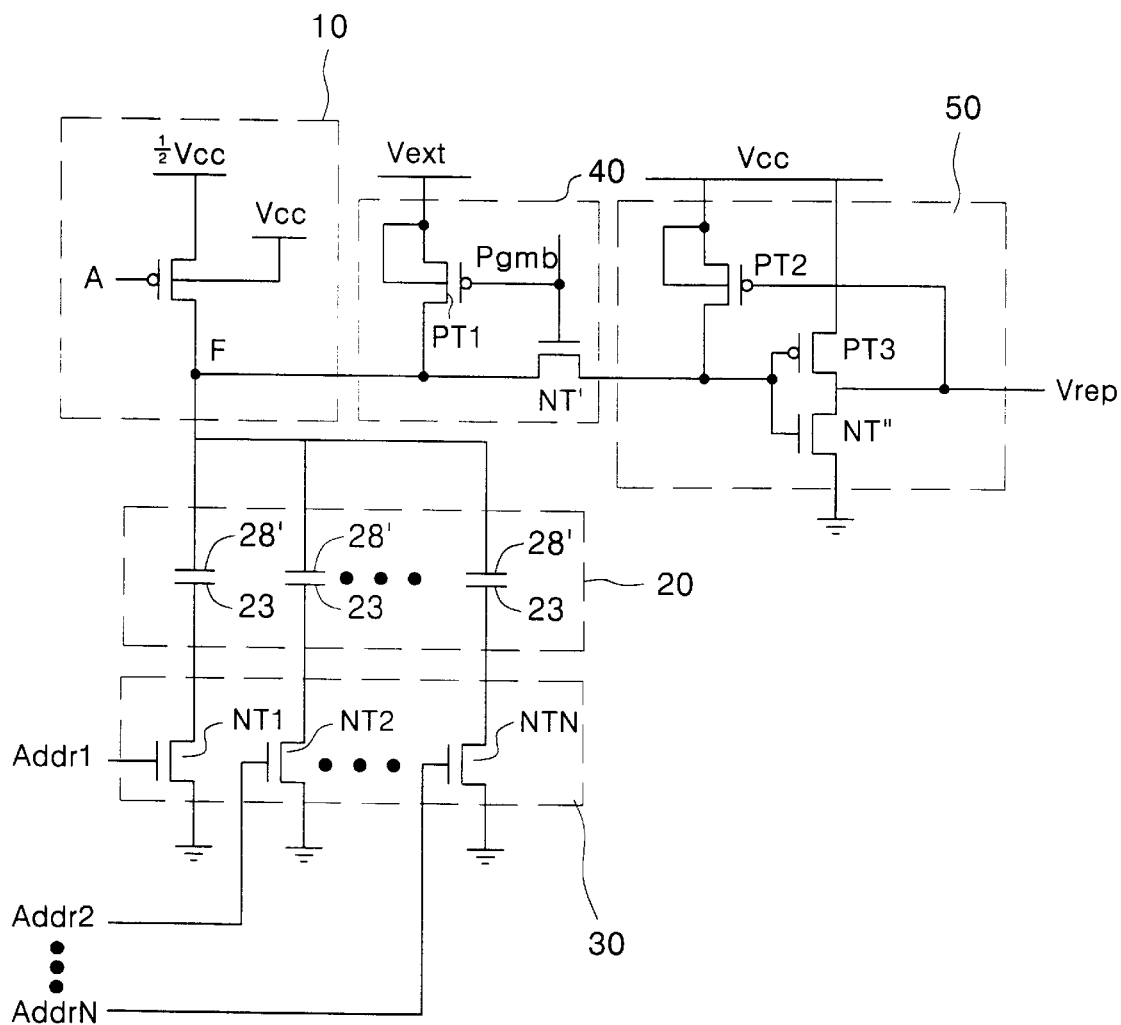
FIG. 1 is a circuit diagram illustrating a programming apparatus of a repair circuit having an anti-fuse for programming a redundancy cell according to the present invention.

FIG. 1 illustrates a programming apparatus of a repair circuit having an anti-fuse for programming a redundancy cell according to the present invention.

As shown therein, the repair circuit includes a half power voltage supplier 10 for supplying a half power voltage(½ Vcc) in response to a driving signal A, a ground voltage supplier 30 formed of a plurality of NMOS transistors NT1, . . . , NTN supplying a ground electric potential in response to address signals Addr1, . . . AddrN, a programming voltage supplier 40 for supplying a programming voltage Vext in response to a programming control signal Pgmb for exchanging a defective cell with a redundancy cell, an anti-fuse 20 in which an upper electrode 28' is connected with an output terminal of the half power voltage supplier 10, and a lower electrode 23 is connected with each drain of the NMOS transistors NT1, . . . , NTN of the ground voltage supplier 30, and an output unit 50 connected with a node F which is commonly connected with an output terminal of the half power voltage supplier 10 and the output terminals of the anti-fuse 20 and the programming voltage supplier 40 for thereby outputting an output signal Vrep based on the programmed state of the anti-fuse.

Here, the power voltage supplier 10 is formed of a PMOS transistor which receives a power voltage Vcc through a substrate, and a half power voltage (½ Vcc) through a drain. The programming voltage supplier 40 is formed of a PMOS transistor PT1 receiving programming voltage Vext through a drain and substrate, and a NMOS transistor NT' having its gate connected with the gate of the PMOS transistor PT1. The output unit 50 includes a first PMOS transistor PT2 receiving a power voltage Vcc through a drain and substrate, and an output signal Vrep through a gate, and a second PMOS transistor PT3 and a NMOS transistor NT'' having their gates commonly connected with an output terminal of the first PMOS transistor PT2 and connected in series between the power voltage Vcc and the ground voltage.

FIG. 2 illustrates a semiconductor apparatus including a repair circuit having a programming apparatus and an anti-fuse according to the present invention. As shown therein, the semiconductor apparatus includes a PMOS transistor and NMOS transistor formed of gate conductive layers 12, 32, spacers 14, 34, and dopant implantation regions 16, 36 formed on a N-well 2 and P-well 4 of a silicon substrate, a lower electrode 23 connected with a dopant implantation region 36 of the NMOS transistor, for example, a drain region, through a contact hole formed in interlayer insulation films 62, 64 formed on the upper surfaces of the transistors for implementing an electric insulation therebetween and having a spacer 24 with its apex higher than an inner portion 22 at an outer portion of the same, a dielectric film 26' formed on the upper portion of the lower electrode 23, an anti-fuse having an upper electrode 28' formed on the upper portion of the dielectric film 26', and a metal wire 70 connected with plugs 18, 29 bonded with the drain region 16 of the PMOS transistor and the upper electrode 28' of the anti-fuse, respectively.

The operation of the repair circuit according to the present invention will be explained with reference to FIGS. 1 and 2.

The half power voltage supplier 10 maintains a turned-off state by a high level driving signal A during the programming of the anti-fuse 20. In the anti-fuse 20, as a control signal Pgmb for programming a defective cell of the programming voltage supplier 40 is transited from a high level to a low level in a state that a half power voltage (½ Vcc) is not received from the half power voltage supplier 10, the PMOS transistor PT1 is turned on, and the upper electrode 281 receives a programming voltage Vext. Thereafter, the anti-fuse 20 receives a ground voltage through the lower electrode 23 as a plurality of NMOS transistors NT1, . . . , NTN are turned on in accordance with high level address signals Addr1, . . . , AddrN. In the anti-fuse 20, the dielectric film 26' near the spacer 24' having its apex which is most weak is broken due to a large voltage difference between the upper electrode 28' and the lower electrode 23 for thereby electrically disconnecting the electrodes 28' and 23. In addition, in the repair circuit according to the present invention, as the control signal Pgmb for programming a defective cell of the programming voltage supplier 40 during the normal operation maintains a high level, the supply of the programming voltage Vext is blocked. As the driving signal A of the half power voltage supplier 10 is transited from a high level to a low level, the voltage of the commonly connected node F is charged. Thereafter, the address signals Addr1, . . . , AddrN are inputted. At this time, in a state that the anti-fuse is programmed, the voltage of the commonly connected node F is transited to a low level and is applied to the output unit 50, the output signal Vrep becomes a high level. In a case that the same is not programmed, the voltage of the commonly connected node F and the half power voltage (½ Vcc) are directly applied to the output unit 50, so that the output signal Vrep becomes a low level.

FIGS. 3 through 10 illustrate a method for fabricating a semiconductor apparatus having an anti-fuse according to the present invention.

As shown therein, the N-well 2 and P-well 4 are formed on the silicon substrate, and a device isolation region 6 is formed for isolating the wells 2 and 4. The gate electrode having the gate conductive layers 12, 32 and the spacers 14, 34 are formed on the upper portions of the wells 2 and 4. The dopant implantation regions 16, 36, for example, a source/drain region, are formed at a portion near the edge portion of the gate electrode by implanting a conductive dopant which is different from the wells for thereby forming a PMOS transistor and NMOS transistor. Thereafter, the insulation film 62 is deposited on the substrate including the above-described transistors.

Figure 4:
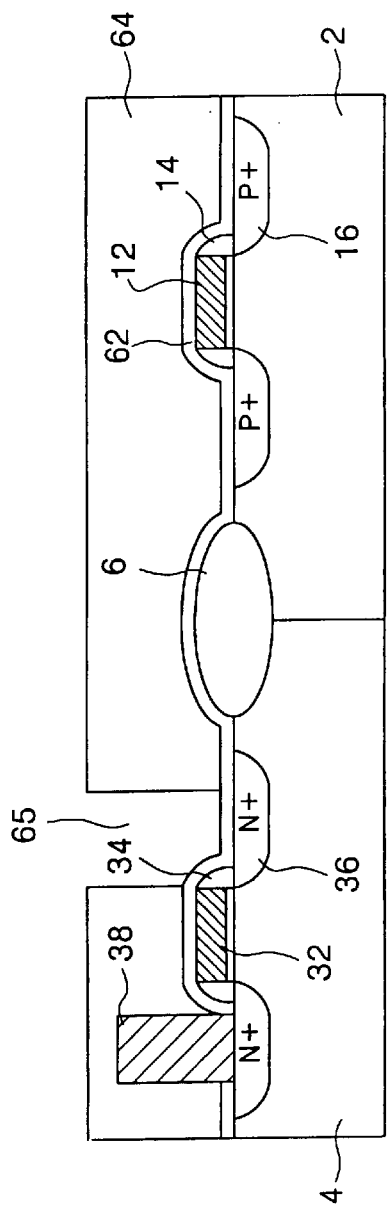

As shown in FIG. 4, a ground line 38 is formed for connecting the source region of the NMOS transistor, and then a lower interlayer insulation film 64 is formed on the upper portion of the resultant structure. In addition, a photo-process and etching process are performed for obtaining a lower electrode region charging a carrier when the gate of the NMOS transistor is turned on, and then the lower interlayer insulation film 64 and the insulation film 62 are sequentially etched to expose the drain region of the NMOS transistor for thereby forming a contact hole 65.

Figure 5:
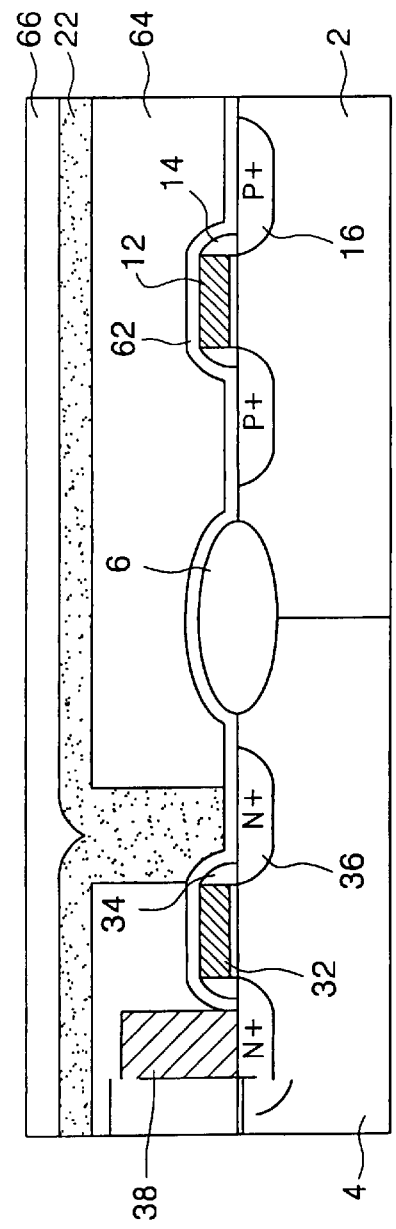

As shown in FIG. 5, the contact hole 65 is filled on the front surface of the interlayer insulation film 64 including the contact hole 65 using the dopant-implanted polysilicon layer 22, and then the insulation film 66 is formed on the front surface of the polysilicon layer 22.

As shown in FIG. 6, the photoprocess is performed for defining a part of the lower electrode of the anti-fuse for thereby forming a photoresist pattern 67 on the upper surface of the insulation film 66.

Thereafter, the etching process is performed. The sequentially stacked insulation film 66 and polysilicon layer 22 are patterned to be aligned with the pattern 67. As shown in FIG. 7, the patterns 22' and 66' defining a part of the lower electrode are formed. In addition, after the photoresist pattern 67 is removed, the dopant-implanted polysilicon layer 24 is formed on the front surface of the resultant structure as a conductive layer.

Figure 8:
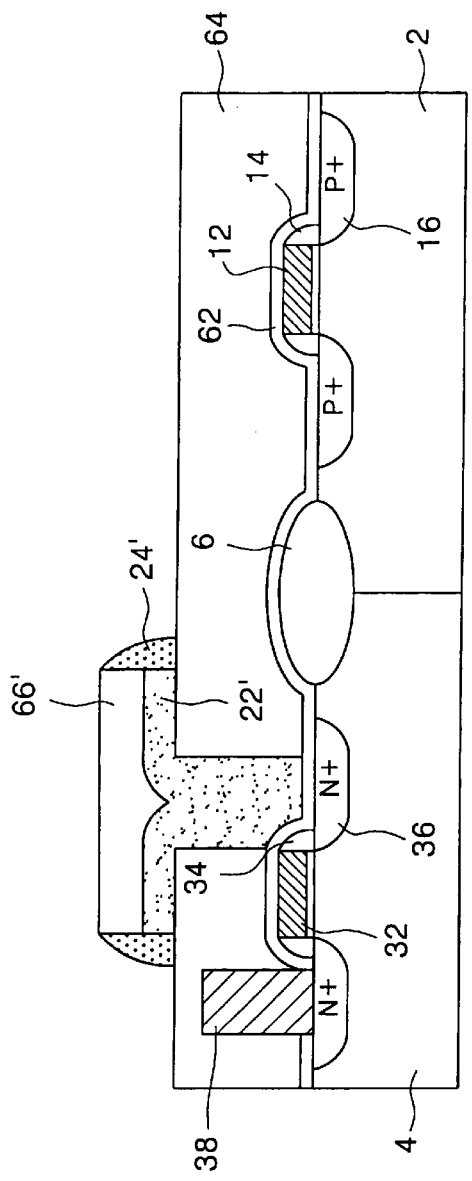

As shown in FIG. 8, the dry etching process is performed for thereby etching the polysilicon layer 24, and then the spacer 24' is formed on the outer surfaces of the patterns 22' 66' of the lower electrode.

Figure 9:
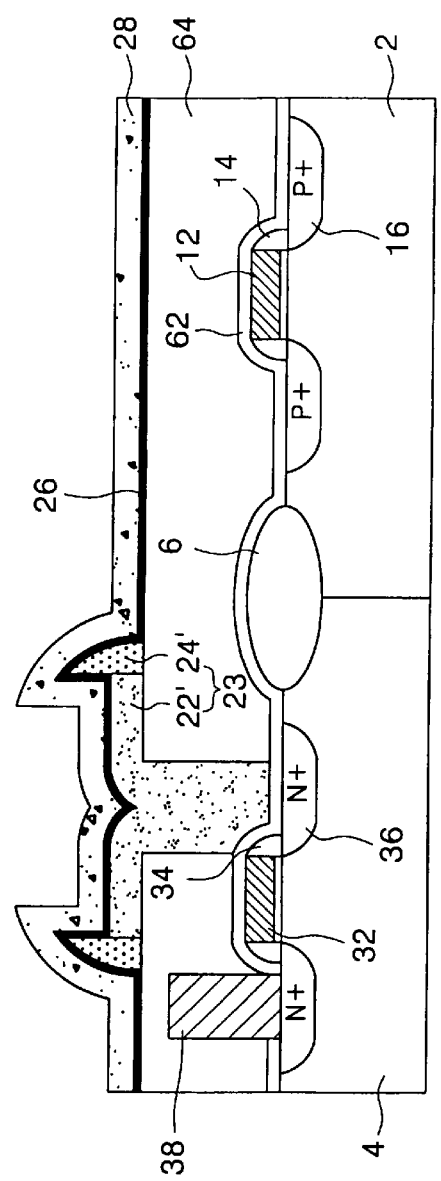

As shown in FIG. 9, the insulation film 66 of the patterns 22', 66' of the lower electrode is removed, so that the lower electrode 23 having the spacer 24' having its apex higher than the inner portion at the outer portion is formed. The oxide film 26 is formed on the upper surface of the lower electrode 23 as a dielectric. The thickness of the resultant structure is 30~100 Å. In addition, the dopant-implanted polysilicon layer 28 is formed on the upper surface of the oxide film 26. Thereafter, the photoprocess and etching process are performed, so that the upper electrode 28' and dielectric film 26' are formed by patterning the sequentially stacked polysilicon layer 28 and oxide film 26.

Figure 10:
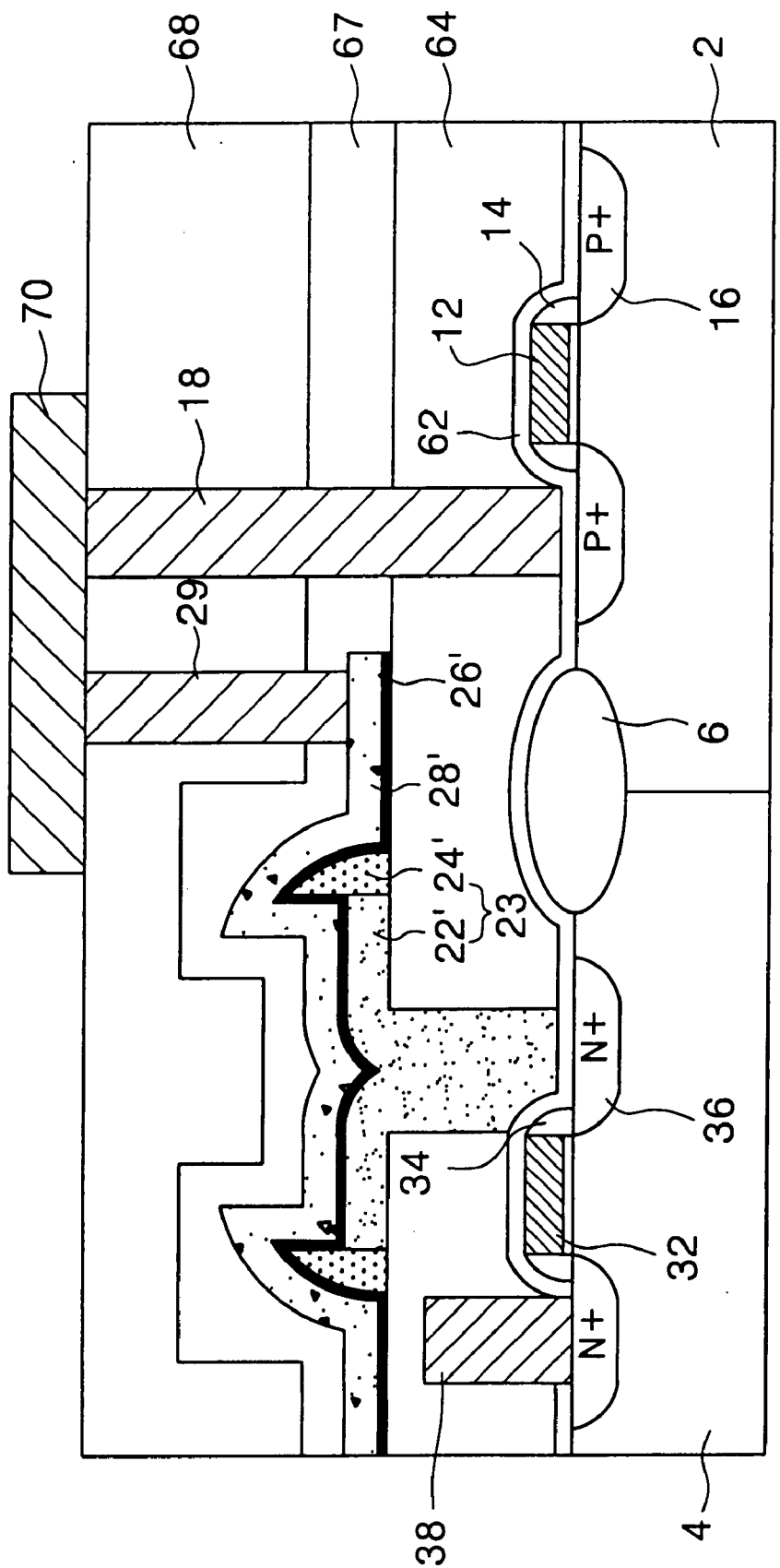

As shown in FIG. 10, the upper interlayer insulation films 67 and 68 are formed on the upper surfaces of the upper electrode 28' and the lower interlayer insulation film 64, and then the wiring process is performed, whereby the metal wiring 70 is formed for connecting the plugs 18, 29 contacting with the upper electrode 28' and the source region of the PMOS transistor.

In the present invention, it is possible to form an anti-fuse programmed so that the defective cell is exchanged with the redundancy cell through the normal DRAM capacitor process based on the conventional DRAM process. The fabrication process is also simplified.

In the present invention, the repair circuit having the anti-fuse is connected at the redundant bank cell, so that it is possible to perform a repairing operation at any time if necessary.

In addition, the dielectric film contacting with the spacer having its apex of the lower electrode is applied with a current for thereby breaking the same for thereby implementing an anti-fuse simply programmed.

Therefore, in the present invention, it is possible to perform programming at a voltage lower than a programming voltage or a breakage voltage of the dielectric film without using an expensive repair laser apparatus.

In the fabrication process according to the present invention, since the anti-fuse is fabricated by the spacer process during the capacitor process of the DRAM, the fabrication process is simplified.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. In a method for forming an anti-fuse programmed for exchanging a defective cell of a memory cell array with a redundancy cell, an anti-fuse fabrication method of a repair circuit for programming a redundancy cell, comprising the steps of:

forming a lower interlayer insulation film on an upper portion of a semiconductor device including a dopant implantation region formed on a semiconductor substrate;

forming a lower electrode contacting with a dopant implantation region of the semiconductor device through a contact hole in the lower interlayer insulation film and having a spacer having its apex at an outer portion of the same;

forming a dielectric film on an upper portion of the lower electrode; and forming an upper electrode on an upper portion of the dielectric film.

2. The method of claim 1, wherein said step for forming the lower electrode includes the sub-steps of:

forming a contact hole in the lower interlayer insulation film to expose a dopant implantation region of the semiconductor device therethrough;

depositing a conductive layer on an upper portion of the interlayer insulation film including the contact hole;

depositing an insulation film on an upper portion of the conductive layer;

forming a pattern defining a part of the lower electrode for patterning the sequentially stacked insulation film and conductive layer;

forming a spacer formed of a conductive layer on an outer surface of the thusly formed pattern; and removing the insulation film forming the pattern.

3. The method of claim 1, wherein said lower and upper electrodes are formed of dopant-implanted polysilicon.

4. The method of claim 1, wherein said lower and upper electrodes are formed of a refractory metal.

5. The method of claim 4, wherein said metal is one selected from the group comprising Ta and Ti.

6. The method of claim 1, wherein said dielectric film is formed of an oxide film.

7. The method of claim 1, wherein said dielectric film is formed of a combined film in which an oxide film, a nitride film and oxide film are sequentially stacked.

8. The method of claim 1, wherein the thickness of said dielectric film is 30~100 Å.

* * * * *